United States Patent
Lu

(10) Patent No.: US 12,176,018 B2
(45) Date of Patent: Dec. 24, 2024

(54) SEMICONDUCTOR MEMORY, METHOD FOR REFRESHING, METHOD FOR CONTROLLING AND ELECTRONIC DEVICE

(71) Applicant: CHANGXIN MEMORY TECHNOLOGIES, INC., Hefei (CN)

(72) Inventor: Huan Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 173 days.

(21) Appl. No.: 17/935,557

(22) Filed: Sep. 26, 2022

(65) Prior Publication Data

US 2023/0009877 A1  Jan. 12, 2023

Related U.S. Application Data

(63) Continuation of application No. PCT/CN2022/098059, filed on Jun. 10, 2022.

(30) Foreign Application Priority Data

Apr. 8, 2022 (CN) .......................... 202210369899.9

(51) Int. Cl.
*G11C 11/40* (2006.01)
*G11C 11/406* (2006.01)
*G11C 11/408* (2006.01)

(52) U.S. Cl.
CPC .. *G11C 11/40618* (2013.01); *G11C 11/40615* (2013.01); *G11C 11/4085* (2013.01)

(58) Field of Classification Search
CPC ........ G11C 11/40618; G11C 11/40615; G11C 11/4085; G11C 11/40611; G11C 11/40622
See application file for complete search history.

(56) References Cited

U.S. PATENT DOCUMENTS

| | | | |
|---|---|---|---|
| 6,977,847 B2 * | 12/2005 | Lasser | G11C 16/16 365/185.29 |
| 10,572,377 B1 | 2/2020 | Zhang | |
| 2012/0317386 A1 | 12/2012 | Driever | |
| 2013/0103916 A1 | 4/2013 | Driever et al. | |
| 2015/0242328 A1 | 8/2015 | Driever et al. | |
| 2017/0011792 A1 | 1/2017 | Oh et al. | |

(Continued)

FOREIGN PATENT DOCUMENTS

| | | |
|---|---|---|
| CN | 101017448 A | 8/2007 |
| CN | 104317527 A | 1/2015 |

(Continued)

OTHER PUBLICATIONS

"JESD79-4B DDR4 SDRAM data sheet" (Revision of JESD79-4A, Nov. 2013) Jun. 2017, http://www.softnology.biz/pdf/JESD79-4B.pdf.

*Primary Examiner* — Xiaochun L Chen
(74) *Attorney, Agent, or Firm* — Syncoda LLC; Feng Ma

(57) ABSTRACT

A semiconductor memory includes a main memory area and a tag memory area. A plurality of memory groups are set in the main memory area and a plurality of flag bits are set in the tag memory area. Each of the plurality of memory groups has a corresponding relationship with one of the plurality of flag bit. The flag bit is at least configured to indicate whether at least one memory cell in the memory group has a specific state. The specific state includes an occupied state.

13 Claims, 11 Drawing Sheets

(56) References Cited

U.S. PATENT DOCUMENTS

| | | | |
|---|---|---|---|
| 2018/0158507 A1 | 6/2018 | Bang | |
| 2018/0196705 A1* | 7/2018 | Miller | G06F 3/0659 |
| 2019/0056874 A1 | 2/2019 | Lee et al. | |
| 2020/0090750 A1 | 3/2020 | Zhang et al. | |
| 2020/0233608 A1* | 7/2020 | Kim | G11C 29/42 |

FOREIGN PATENT DOCUMENTS

| | | | |
|---|---|---|---|
| CN | 104636285 A | 5/2015 | |
| CN | 108154895 A | 6/2018 | |
| CN | 109408258 A | 3/2019 | |
| CN | 110827884 A | 2/2020 | |
| CN | 111177017 A | 5/2020 | |
| CN | 112106138 A | 12/2020 | |
| CN | 112767983 A | 5/2021 | |
| CN | 113282240 A | 8/2021 | |
| CN | 114093407 A | 2/2022 | |

\* cited by examiner

SEMICONDUCTOR MEMORY, METHOD FOR REFRESHING, METHOD FOR CONTROLLING AND ELECTRONIC DEVICE

CROSS-REFERENCE TO RELATED APPLICATIONS

This is a continuation of International Application No. PCT/CN2022/098059 filed on Jun. 10, 2022, which claims priority to Chinese Patent Application No. 202210369899.9 filed on Apr. 8, 2022. The disclosures of the above-referenced applications are hereby incorporated by reference in their entirety.

BACKGROUND

In the traditional dynamic random access memory, it is necessary to maintain the data of respective memory cells by periodic refresh. Specifically, all the memory rows in a certain memory array can be refreshed sequentially, or the memory rows in the memory array can be divided into several groups and be refreshed according to the groups. However, the above refresh manner will still produce high power consumption.

SUMMARY

The present disclosure relates to the field of semiconductor memory technology, in particular to a semiconductor memory, a method for refreshing, a method for controlling and an electronic device.

The disclosure provides a semiconductor memory, a method for refreshing, a method for controlling and an electronic device. Whether there is an occupied memory cell in a corresponding memory group is indicated by the flag bit, which can provide more information for the control process and improve the control efficiency.

The technical solutions of the present disclosure are implemented as follows.

In a first aspect, the embodiment of the present disclosure provides a semiconductor memory. The semiconductor memory includes a main memory area and a tag memory area. A plurality of memory groups are set in the main memory area and a plurality of flag bits are set in the tag memory area.

Each of the plurality of memory groups has a corresponding relationship with one of the plurality of flag bits, and the flag bit is at least configured to indicate whether at least one memory cell in the memory group has a specific state. The specific state includes an occupied state.

In a second aspect, the embodiment of the present disclosure provides a method for refreshing. The method is applied to a semiconductor memory including a plurality of memory groups and a plurality of flag bits. Each of the plurality of flag bits is configured to indicate at least whether at least one memory cell in one memory group has a specific state, and the specific state includes an occupied state. The method includes the following operations.

A target memory group is determined according to a preset refresh sequence after receiving a refresh instruction.

Reading is performed on a flag bit of the target memory group to obtain a reading result.

Whether to perform refresh process on the target memory group is determined according to the reading result.

In a third aspect, the embodiment of the present disclosure discloses a method for controlling. The method is applied to a memory controller. The memory controller is connected to a semiconductor memory. The semiconductor memory includes a plurality of memory groups and a plurality of flag bits. Each of the plurality of flag bits is at least configured to indicate whether at least one memory cell in one memory group has a specific state. The specific state includes an occupied state. The method includes the following operations.

A memory application instruction is received. The memory application instruction is configured to indicate an occupied memory cell.

A memory allocation instruction is generated according to an address of the memory cell.

The memory allocation instruction is sent to the semiconductor memory to adjust a flag bit of a memory group to which the memory cell belongs to a first state.

In a fourth aspect, the embodiment of the present disclosure provides an electronic device. The electronic device includes a memory controller and a semiconductor memory described in the first aspect.

DETAILED DESCRIPTION

Figure 1:
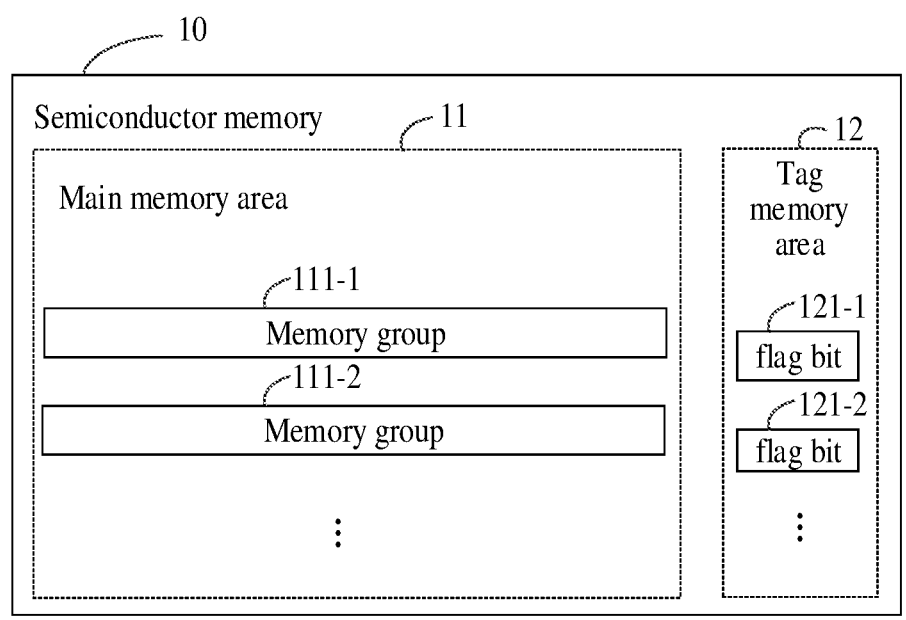
FIG. 1 is a structural schematic diagram of a semiconductor memory provided by the embodiments of the present disclosure.

The technical solutions in the embodiments of the present disclosure will be clearly and completely described below in conjunction with the drawings in the embodiments of the present disclosure. It is to be understood that the specific embodiments described herein are intended only to explain the relevant application and not to limit the present disclosure. In addition, it should be noted that for ease of description, only portions related to the application are shown in the drawings.

Unless otherwise defined, all technical and scientific terms used herein have the same meanings as are commonly understood by those skilled in the art of the present disclosure. The terminology used herein is for the purpose of describing embodiments of the present disclosure only and is not intended to limit the present disclosure.

In the following description, reference is made to "some embodiments" that describe a subset of all possible embodiments, but it is understood that "some embodiments" may be the same subset or different subsets of all possible embodiments and may be combined with each other without conflict.

It should be pointed out that, the term "first\second\third" referred to in embodiments of the present disclosure is used only to distinguish similar objects, without representing a particular ordering of objects. It is understood that "first\second\third" may be interchanged in a particular order or priority order where permitted, so that the embodiments of the present disclosure described herein can be implemented in an order other than that illustrated or described herein.

At present, refresh operations in volatile memory are performed sequentially for memory rows or memory groups, which result in high power consumption.

Based on this, the embodiments of the present disclosure provide a semiconductor memory, which includes a main memory area and a tag memory area. A plurality of memory groups are set in the main memory area, and a plurality of flag bits are set in the tag memory area. Each of the plurality of memory groups has a corresponding relationship with one of the plurality of flag bits, and the flag bit is at least configured to indicate whether at least one memory cell in the memory group has a specific state. The specific state includes an occupied state. In this way, the tag memory area is added in the semiconductor memory, and whether there is an occupied memory cell in the corresponding memory group is indicated by the flag bit, so that more information can be provided for the control process of the semiconductor memory, the control efficiency of the semiconductor memory is improved, and the power consumption is reduced.

Various embodiments of the present disclosure will be described in detail below with reference to the accompanying drawings.

In an embodiment of the present disclosure, referring to FIG. 1, a schematic structural diagram of a semiconductor memory 10 provided by some embodiment of the present disclosure is shown. As shown in FIG. 1, the semiconductor memory 10 includes a main memory area 11 and a tag memory area 12. A plurality of memory groups (for example, the memory group 111-1, the memory group 111-2 . . . in FIG. 1) are set in the main memory area. A plurality of flag bits (for example, the flag bit 121-1, the flag bit 121-2 . . . in FIG. 1) are set in the tag memory area. Each of the plurality of memory groups has a corresponding relationship with one of the plurality of flag bits, and the flag bit is at least configured to indicate whether at least one memory cell in the memory group has a specific state. The specific state includes an occupied state.

It should be noted that the semiconductor memory 10 may be a volatile memory, such as Dynamic Random Access Memory (DRAM). In the semiconductor memory 10, a tag memory area 12 is added for recording the state information of various memory groups in the main memory area 11, so that the semiconductor memory can be controlled more pertinently, the control efficiency can be improved and the power consumption can be reduced.

In the embodiment of the present disclosure, the memory group is the smallest unit for performing the refresh operation, and the flag bit is configured to record the state information of the memory group.

It should also be noted that in the embodiment of the present disclosure, the specific state at least includes an occupied state, and may also include a damaged state, a locked state, a released state and the like. Further, in different application scenarios, the memory cell is occupied may have different definitions. For example, the occupied state represents that the memory cell is allocated for use by a user, or the occupied state represents that valid data is stored in the memory cell.

Thus, taking the refresh operation as an example, because of the existence of the flag bit, refresh is only performed on the memory group in which the occupied memory cells exist, and refresh is not performed on the memory group in which all the memory cells are not occupied, thereby saving power consumption and improving the performance of the semiconductor memory.

Figure 2:
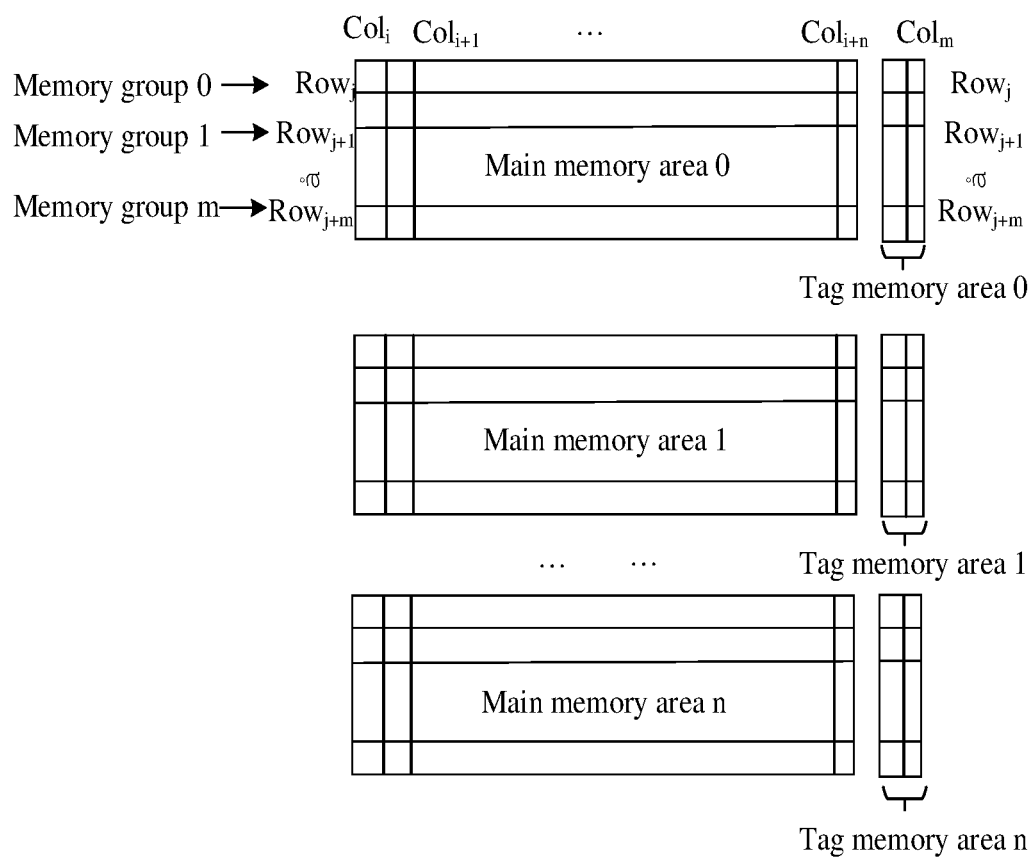
FIG. 2 is a structural diagram of another semiconductor memory provided by some embodiments of the present disclosure.
Figure 3:
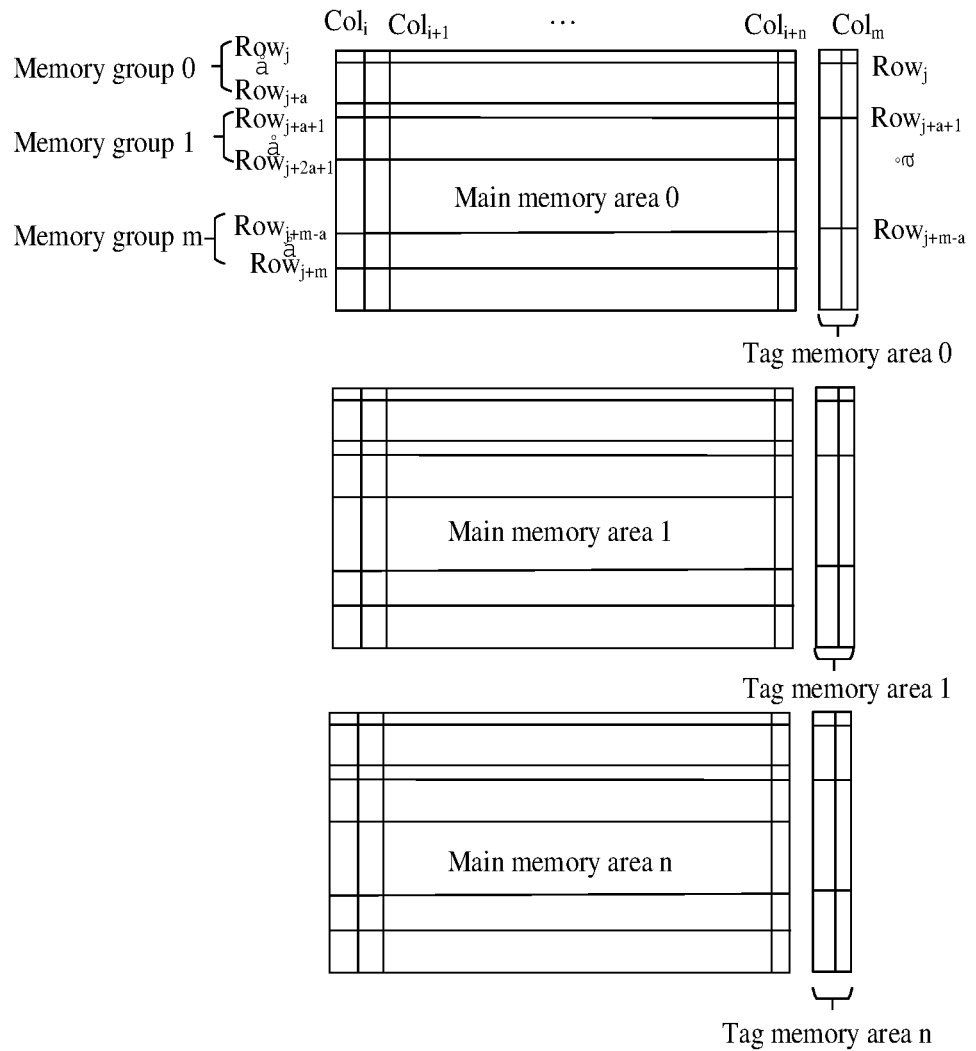
FIG. 3 is a schematic structural diagram of yet another semiconductor memory provided by some embodiments of the present disclosure.

Referring to FIG. 2, a schematic structural diagram of another semiconductor memory provided by some embodiments of the present disclosure is shown. Referring to FIG. 3, a schematic structural diagram of yet another semiconductor memory provided some embodiments of the present disclosure is shown. In FIG. 2 and FIG. 3, the semiconductor memory 10 includes a plurality of different memory arrays (Banks), a portion of each memory array belongs to a main memory area (for example, main memory area 0, main memory area 1 . . . and main memory area n in FIG. 2) and another portion of each memory array belongs to a tag memory area (for example, tag memory area 0, tag memory area 1 . . . tag memory area n in FIG. 2). In FIG. 2, each memory row (or called word line) is represented by Row, each memory column is represented by Col (or called bit line), and the subscript of the memory row or memory column represents the number. In embodiments of the present disclosure, the various numbers are only used to identify various memory rows or memory columns, which do not constitute any position limitation. In addition, the intersection point of each memory row and each memory column can be regarded as the existence of a memory cell.

In some embodiments, each memory group includes a memory row, and a portion, extending to the tag memory area, of the memory row is configured to form a flag bit corresponding to the memory group.

Taking a flag bit occupying one memory cell as an example, as shown in FIG. 2, the memory cells formed by the memory row $Row_j$ and the bit lines $Col_i$~$Col_{i+n}$ consists of a memory group, and the memory row $Row_j$ and the bit line $Col_m$ form the flag bit of the memory group. The memory cells formed by the memory row $Row_{j+1}$ and the bit lines $Col_i$~$Col_{i+n}$ consists of another memory group, and the memory row $Row_{j+1}$ and the bit line $Col_m$ form a flag bit of the memory group. Others can be understood by reference to the above.

It should be noted that, there is no specific position relationship between the main memory area 11 and the tag memory area 12. For example, the tag memory area 12 may be set outside the main memory area 11. Taking the memory row $Row_j$ as an example, the bit line $Col_m$ is located on the side of the bit line $Col_{i+n}$, away from the bit line $Col_i$, or the bit line $Col_m$ is located on the side of the bit line $Col_{i+N}$ away from the bit line $Col_i$. For another example, the tag memory area 12 may be set in the interior of the main memory area 11. Taking the memory row $Row_j$ as an example, the bit line $Col_m$ is located between the bit line $Col_i$ and the bit line $Col_{i+n}$.

Exemplarily, a memory array may be set 1024 bit lines belonging to the main memory area and 1 bit line belonging to the tag memory area. That is, the ratio of bit lines in the main memory area 11 to the tag memory area 12 is 1024:1, and the area ratio of the tag memory area 12 is less than 0.1%. Therefore, the influence of setting the tag memory area 12 on the chip area is very small.

In other embodiments, each memory group includes a plurality of memory rows, and a portion, extending to the tag memory area 12, of one of the memory rows is configured to form a flag bit corresponding to the memory group. Here, the numbers of memory rows in different memory groups can be the same or different.

Taking a flag bit occupying one memory cell as an example, as shown in FIG. 3, the memory cells formed by the memory rows $Row_j$~$Row_{j+a}$ and the bit lines $Col_i$~$Col_{i+n}$ consist of a memory group, and the memory row $Row_j$ and the bit line $Col_m$ form the flag bit of the memory group. The memory cells formed by at least one memory row $Row_{j+a+1}$~$Row_{j+2a+1}$ and at least one bit line $Col_i$~$Col_{i+n}$ consist of another memory group, and the memory row $Row_{j+a+1}$ and the bit line $Col_m$ form the flag bit of the memory group. Others can be understood by reference to the above.

It should also be noted that, with respect to FIG. 2 or FIG. 3, a portion, extending to the tag memory area 12, of the memory row in the main memory area 11 may be used to form a corresponding flag bit. That is, the flag bit in the tag memory area 12 share the same memory row with the main memory area 11. In other embodiments, the main memory area 11 and the tag memory area 12 may be two relatively independent areas, and the flag bit in the tag memory area 12 do not share the same memory row with the main memory area 11.

In some embodiments, in a case that the specific state includes at least two states, each of the plurality of flag bits includes at least two identifiers, and different identifiers are configured to indicate different specific states. Each of the at least two identifiers occupies a memory cell.

That is, one flag bit may occupy more memory cells, which specifically depends on the types of specific states.

It should be noted that in the case where each memory group includes one memory row, as shown in FIG. 2, at least two bit lines may exist in the tag memory area 12, so that a portion, extending to the tag memory area, of each memory row may form at least two identifiers.

In a case where each memory group includes a plurality of memory rows, as shown in FIG. 3, at least two bit lines may exist in the tag memory area 12, so that a portion, extending to the tag memory area 12, of one of the memory rows in each memory group may form at least two identifiers. Alternatively, only one bit line may exist in the tag memory area 12, so that the portions, extending to of the tag memory area 12, of at least two memory rows in each memory group may form at least two identifiers.

It should be noted that the tag memory area 12 may be set on opposite sides of the main memory area 11, so as to play a role of protecting the memory row. It is assumed that two bit lines exist in the tag memory area 12. The two bit lines may be respectively set on both sides of the main memory area 11, and the formed first identifier and the second identifier may not only play the role of identification, but also play the role of protecting the memory group. That is, when the memory array is damaged, the tag memory area 12 will be damaged preferentially instead of the main memory area 11, thus ensuring the effectiveness of the basic function.

In addition, it is considered that for the semiconductor memory 10, redundant area is generally set for memory cells in the main memory area 11 to replace damaged memory cells in the main memory area 11. Therefore, the tag memory area 12 may also be located in the interior of the main memory area 11. When the memory array is damaged, the main memory area 11 will be damaged preferentially instead of the tag memory area 12, so as to avoid the tag memory area 12 to be inoperable.

In some embodiments, the state of the flag bit may be defined using instructions/operations already in the DRAM. Exemplarily, the semiconductor memory 10 is further configured to adjust the flag bit of the memory group to which a memory cell belongs to a first state after receiving a memory allocation instruction for the memory cell. The memory allocation instruction may be a word line activation instruction Active. Alternatively, the flag bit of the memory group is adjusted to a second state after performing refresh on the memory group.

That is to say, after receiving the word line activation instruction Active, when activating the designated memory row, simultaneously, the flag bit corresponding to the memory row is adjusted to the first state. After performing refresh on the memory row, the flag bit of the memory group is adjusted to the second state. In this way, there is no need to define additional state control instructions for flag bits, thus saving signaling resources.

In other embodiments, the state of the flag bit may be constructed based on the memory application/memory release functionality in the DRAM. Exemplarily, the semiconductor memory 10 is further configured to adjust the flag bit of the memory group to which the memory cell belongs to a first state after receiving a memory allocation instruction for the memory cell. The memory allocation instruction is constructed by utilizing a first reserved code in a memory controller. Alternatively, the semiconductor memory 10 is further configured to adjust the flag bit of the memory group to a second state after receiving a memory release instruction for the memory group. The memory release instruction is constructed by utilizing a second reserved code in the memory controller.

It should be understood that some Mode Registers exist in the semiconductor memory 10. Operand (OP) in each Mode Register is used for providing different control functions. Some general OPs are specified by industry standards, and at the same time, some reserved codes (Reserved for Use, RFU) that are not enabled exist in the mode registers. At this time, a brand-new Allocate instruction may be constructed through these reserved codes as memory allocation instruction, and a brand-new Release instruction may be constructed through these reserved codes as memory release instruction. In this way, in the working process of the semiconductor memory, part of the memory may be applied through the memory allocation instruction Allocate, and the flag bit of the memory group corresponding to the applied memory area is adjusted to the first state based on the memory allocation instruction Allocate. Accordingly, part of the memory may be released through the memory release instruction Release, and the flag bit of the memory group corresponding to the released memory area is adjusted to the second state based on the memory release instruction Release. Thus, the state of the standard bit can be adjusted more accurately, and the accurate execution of the refresh operation can be ensured.

It should be emphasized that, the memory allocation instruction Allocate and the memory release instruction Release in the present disclosure are not functions realizable at the software level. They are actual instructions for signal interaction actually implemented in the memory. The instructions are not proposed in the existing memory industry standard JEDEC, and once the existing memory is required to support such instructions, they need to be indicated in the corresponding JEDEC. Therefore, it can be considered that this hardware function is not supported during the existing period following JEDEC standard.

In yet other embodiments, the semiconductor memory 10 is further configured to adjust the flag bit of the memory group to which the memory cell belongs to the first state after receiving the memory allocation instruction for the memory cell. The memory allocation instruction is the word line activation instruction Active. Alternatively, the semiconductor memory 10 is further configured to adjust the flag bit of the memory group to the second state after receiving the memory release instruction for the memory group. The memory release instruction is constructed by utilizing the second reserved code in the memory controller.

In this way, after activation and before release, the corresponding flag bit is always in the first state, which can more accurately identify that the memory cell is in the occupied state.

It should be noted that the first state may represent that data 1 is stored in the flag bit, and the second state may represent that data 0 is stored in the flag bit. Alternatively, the first state may represent that data 0 is stored in the flag bit, and the second state may represent that data 1 is stored in the flag bit.

To sum up, the embodiment of the present disclosure provides a new memory structure, in which a tag memory area is added in a semiconductor memory, and the flag bit is configured to indicate the state information of each memory group, so as to realize the flag of a refresh target. In the refresh process, the occupation judgment is increased based on the flag bit. That is, whether an occupied memory cell exists in the memory group is judged, so as to accurately determine the refresh object. In addition, the existing instructions in DRAM can be multiplexed to control the state of the flag bit, or new instructions Allocate and Release may be constructed based on memory application/memory release to control the state of the flag bit, which can be selected by those skilled in the art according to actual application scenarios.

Figure 4:
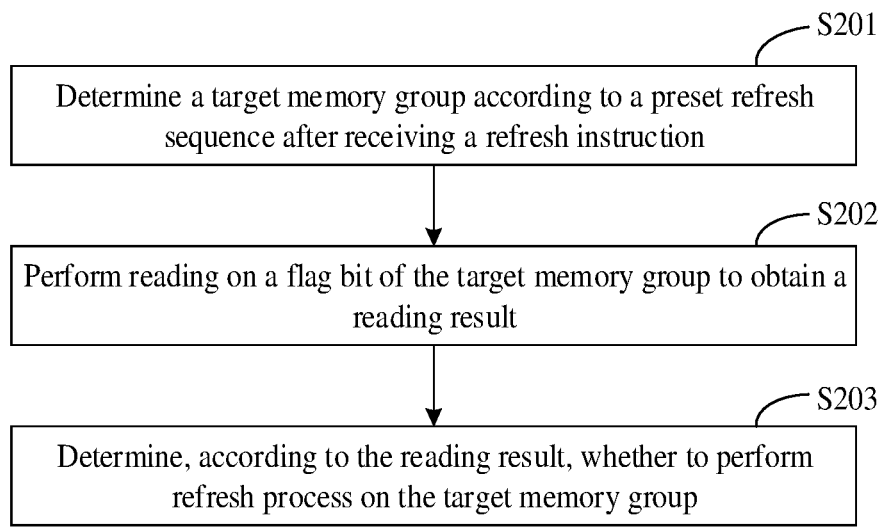
FIG. 4 is a flow diagram of a method for refreshing provided by some embodiments of the present disclosure.

In another embodiment of the present disclosure, see FIG. 4, a flow diagram of a method for refreshing provided by some embodiments of the present disclosure is shown. As shown in FIG. 4, the method includes the following steps.

In step S201, a target memory group is determined according to a preset refresh sequence after receiving a refresh instruction.

In step S202, reading is performed on a flag bit of the target memory group to obtain a reading result.

In step S203, whether to perform refresh process on the target memory group is determined according to the reading result.

It should be noted that, the refresh method for refreshing provided by the embodiments of the present disclosure is applied to a semiconductor memory. The semiconductor memory includes a plurality of memory groups and a plurality of flag bits, one flag bit has a corresponding relationship with one memory group, and the flag bit is at least configured to indicate whether at least one memory cell in the memory group has a specific state. The specific state includes an occupied state. Here, the target memory group includes a memory row. Alternatively, the target memory group includes a plurality of memory rows.

Thus, the embodiments of the present disclosure provide a semiconductor memory refresh method with low power consumption. After receiving the refresh instruction, whether the occupied memory cell exists in the target memory group can be known through the flag bit of the target memory group, so as to decide whether to refresh the target memory group and determine the effective refresh object, thereby performing the refresh operation with higher accuracy and saving power consumption.

In some embodiments, the operation of determining, according to the reading result, whether to perform a refresh process on a target memory group includes the following operations.

In a case that the flag bit is in a first state, refresh process is performed on the target memory group.

In a case that the flag bit is in a second state, refresh process is not performed on the target memory group, and the next refresh instruction is waited for.

In other embodiments, the operation of determining, according to the reading result, whether to perform refresh process on the target memory group includes the following operations.

In a case that the flag bit is in a first state, refresh process is performed on the target memory group.

In a case that the flag bit is in a second state, refresh process is not performed on the target memory group, the next memory group of the target memory group is re-determined as the target memory group, and the step of performing reading on the flag bit of the target memory group is returned to be performed.

Exemplarily, the first state represents that data 1 is stored in the flag bit, and the second state represents that data 0 is stored in the flag bit. Alternatively, the first state represents that data 0 is stored in the flag bit, and the second state represents that data 1 is stored in the flag bit.

It can be seen from the above that if the flag bit is in the first state, it represents that an occupied memory cell exists in the target memory group, and it is necessary to perform refresh process on the target memory group. If the flag bit is in the second state, it represents that no occupied memory cell exists in the target memory group, and refresh process is not performed on the target memory group. Further, in the case of not performing the refresh process on the target memory group, at least two different process mechanisms may be provided: (1) waiting: if the flag bit is detected to be in the second state, it is regarded as ending the execution of the refresh instruction, and the next refresh instruction is waited for; (2) skipping: if the flag bit is detected to be in the second state, the current memory group is skipped and the state of the flag bit of the next memory group is continued to be judged until a refresh operation is performed on a certain memory group, thereby ending the execution of the refresh instruction.

In some embodiments, the method further includes the following operations.

After receiving the memory allocation instruction for the memory cell, the flag bit of the memory group to which the memory cell belongs is adjusted to the first state. After performing refresh on the memory group, the flag bit of the memory group is adjusted to the second state. In this case, the memory allocation instruction may refer to the word line activation instruction Active.

It should be noted that, in other embodiments, the flag bit of the memory group may not be adjusted after performing refresh on the memory group. That is, the flag bit of the memory group is maintained in the first state. As for which operation to perform, it may be defined by the user or according to the usage scenario before leaving the factory. For example, if a read-write operation will be undergone by the memory group in a preset duration after the refresh, the memory group may be adjusted to a write state after the refresh. If a read-write operation may not be undergone by the memory group within a preset duration after the refresh, the flag bit of the memory group may be maintained in the first state after the refresh. The principle that both ideas need to follow is that, ensuring the case of not refreshing the address specified by the memory allocation instruction permanently will not be occurred due to the refresh adjustment of the flag bit, and the flag bit will be flipped to the first state due to the reading and writing operation of the memory group, or the flag bit will be automatically flipped to the first state in a preset duration after the reading and writing operations are not undergone, so as to ensure the timely refresh of the memory group. Understandably, the preset duration may be set according to the failure characteristics of the memory group. For example, the slower the leakage rate is, the longer the preset duration is.

In other embodiments, the method further includes the following operations.

After receiving the memory allocation instruction for the memory cell, the flag bit of the memory group to which the memory cell belongs is adjusted to the first state. After receiving the memory release instruction for the memory group, the flag bit of the memory group is adjusted to the second state. At this time, the memory allocation instruction is an Allocate instruction constructed by the first reserved code, and the memory release instruction is a Release instruction constructed by the second reserved code.

In still other embodiments, the method further includes the following operations.

After receiving the memory allocation instruction for the memory cell, the flag bit of the memory group to which the memory cell belongs is adjusted to the first state. After receiving the memory release instruction for the memory group, the flag bit of the memory group is adjusted to the second state. At this time, the memory allocation instruction may refer to the word line activation instruction Active, and the memory release instruction is a Release instruction constructed by the second reserved code.

Thus, the embodiment of the present disclosure provides a new method for refreshing, which uses a memory group as the smallest refresh unit to perform refresh, and does not perform refresh on a memory group that has never been accessed (i.e., is not occupied) in a memory array (Bank), thereby reducing refresh power consumption. In addition, the method for refreshing provided by the embodiment of the present disclosure may also be selected to be combined with the function of applying memory/releasing memory in the DRAM, so that the refresh operation can be performed with higher accuracy.

Based on the above idea, with reference to the foregoing FIG. 2, it is assumed that the first state represents that data 1 is stored in the flag bit and the second state represents that write data 0 is stored in the flag bit. Two specific embodiments of the method for refreshing are provided below.

Figure 5A:
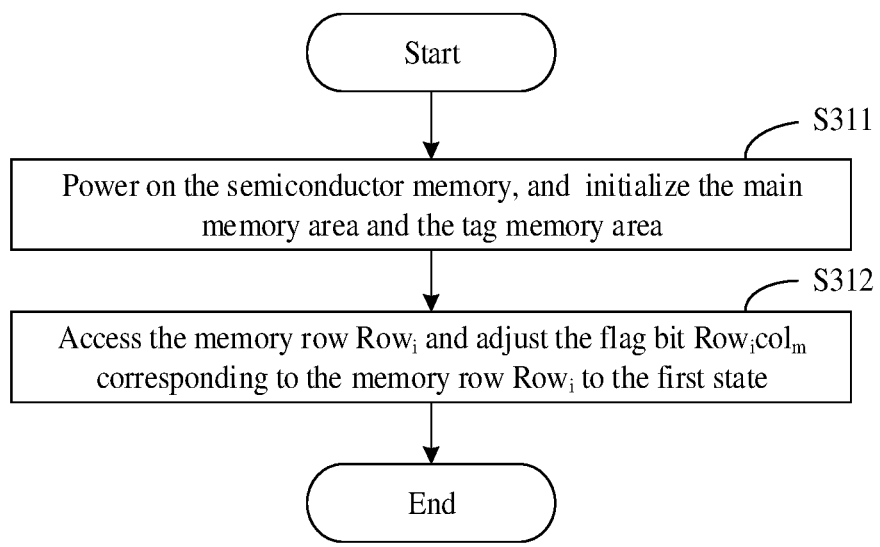
FIG. 5A is a first detailed flow diagram of a method for refreshing provided by some embodiments of the present disclosure.

In the first specific embodiment, only the existing instructions and operations in the DRAM are multiplexed to control the state of the flag bit, and no new instructions are introduced. On the basis of FIG. 2, referring to FIG. 5A, a detailed flow diagram of a method for refreshing provided by some embodiments of the present disclosure is shown. As shown in FIG. 2 and FIG. 5A, the method may include the following steps.

In step S311, the semiconductor memory is powered on, and the main memory area and the tag memory area are initialized.

It should be noted that in the initialization process, data 0 is written to the memory cells in the main memory area and the tag memory area. At this time, all the memory cells in the main memory area are in the unoccupied state, and all the flag bits in the tag memory area are in the second state.

In step S312, the memory row $Row_i$ is accessed, and the flag bit $Row_iCol_m$ corresponding to the memory row $Row_i$ is adjusted to the first state.

Here, the memory row $Row_i$ refers to any memory row in FIG. 2, and the flag bit $Row_iCol_m$ refers to the flag bit formed by the memory row $Row_i$ and the bit line $Col_m$.

Exemplarily, when a word line activation instruction Active is received for the memory row $Row_i$, it is regarded as "accessing the memory row $Row_i$", thereby writing data 1 to the flag bit $Row_iCol_m$, and adjusting the flag bit $Row_iCol_m$ to the first state.

Figure 5B:
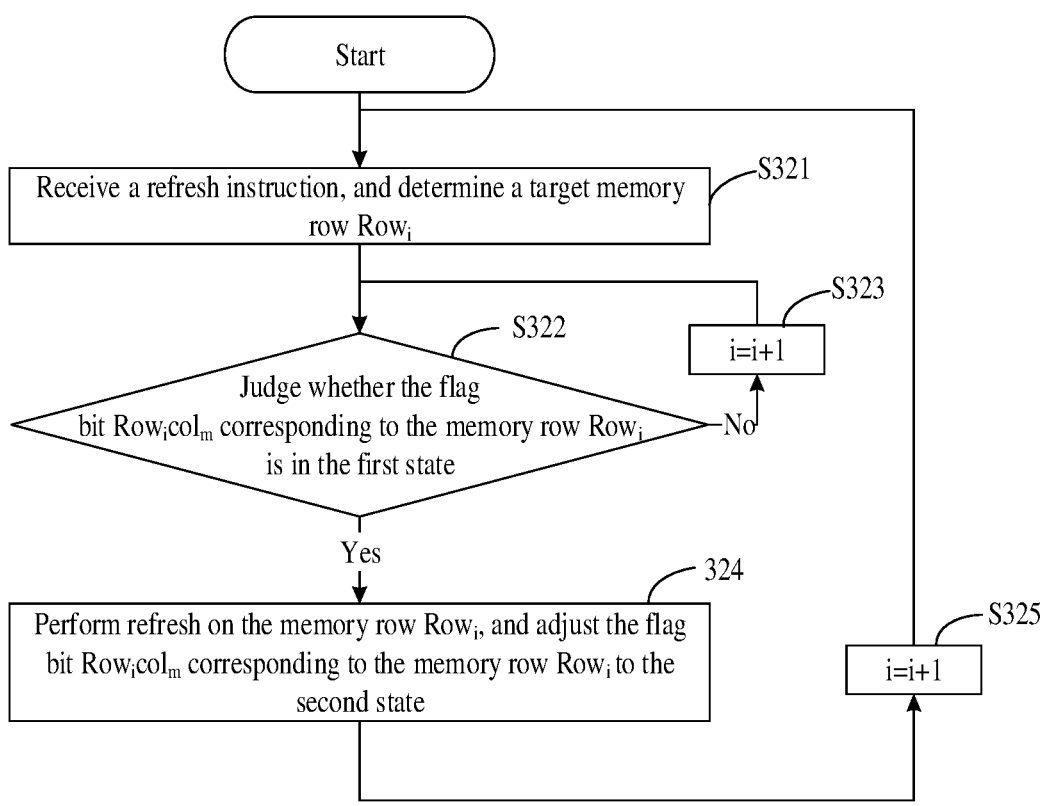
FIG. 5B is a second detailed flow diagram of a method for refreshing provided by some embodiments of the present disclosure.

On the basis of FIG. 2, referring to FIG. 5B, a second detailed flow diagram of a method for refreshing provided by some embodiment of the present disclosure is shown. As shown in FIG. 2 and FIG. 5B, the method may include the following steps.

In step S321, a refresh instruction is received and a target memory row $Row_i$ is determined.

It should be understood that steps S321 and S311 do not have a specific order of execution.

It should be noted that the refresh instruction may be a periodic refresh instruction Refresh, and may also be other kinds of refresh instructions, such as a refresh management instruction for realizing supplementary refresh, etc.

In step S322, whether the flag bit $Row_iCol_m$ corresponding to the memory row $Row_i$ is in the first state is judged.

Here, for the step S322, if the judgment result is No, step S323 is performed, and if the judgment result is Yes, step S324 is performed.

In step S323, i=i+1, and the step S322 is returned to be performed.

It should be noted that if data 0 is stored in the flag bit $Row_iCol_m$, the next memory row of the memory row $Row_i$ is determined as the target memory row, and the flag bit of the target memory row is re-judged until the flag bit of a certain memory row stores data 1.

In step S324, refresh is performed on the memory row $Row_i$, and the flag bit $Row_iCol_m$ corresponding to the memory row $Row_i$ is adjusted to the second state.

It should be noted that if data 1 is stored in the flag bit $Row_iCol_m$, the memory row $Row_i$ is refreshed and data 0 is written to the flag bit $Row_iCol_m$, so that the flag bit $Row_iCol_m$ is adjusted to the second state.

In step S325, i=i+1, and the step S321 is returned to be performed.

In this way, for the received refresh instruction, a refresh operation must be performed once.

In addition, in step S322, if the judgment result is No, it may be regarded as ending the refresh instruction, and step S325 may be performed directly. In this way, the refresh operation may not be performed for the received refresh instruction.

Figure 6A:
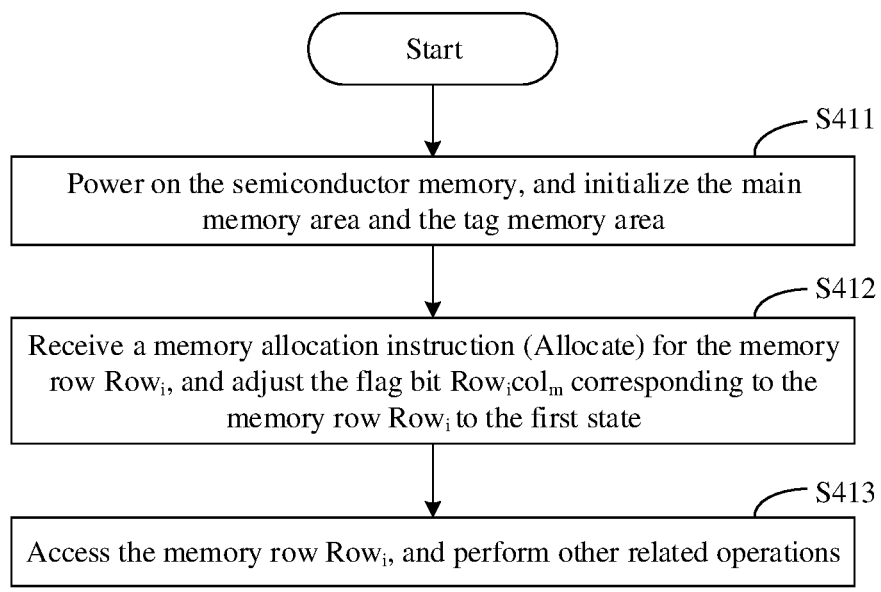
FIG. 6A is a first detailed flow diagram of another method for refreshing provided by some embodiments of the present disclosure.

In another specific embodiment, a new Allocate instruction is constructed as a memory allocation instruction and a new Release instruction is constructed as a memory release instruction through an add instruction function in the Mode Register. Referring to FIG. 6A, a first detailed flow diagram of another method for refreshing provided by some embodiment of the present disclosure is shown. As shown in FIG. 2 and FIG. 6A, the method may include the following steps.

In step S411, the semiconductor memory is powered on, and the main memory area and the tag memory area are initialized.

It should be noted that during the initialization process, data 0 is written to both the main memory area and the tag memory area. At this time, all the memory cells in the main memory area are in the unoccupied state, and all the flag bits in the tag memory area are in the second state.

In step S412, the memory allocation instruction Allocate for the memory row $Row_i$ is received, and the flag bit $Row_iCol_m$ corresponding to the memory row $Row_i$ is adjusted to the first state.

Thus, after receiving the memory allocation instruction Allocate, data 1 is written to the flag bit $Row_iCol_m$ to adjust the flag bit $Row_iCol_m$ to the first state.

In step S413, the memory row $Row_i$ is accessed and other related operations are performed.

Figure 6B:
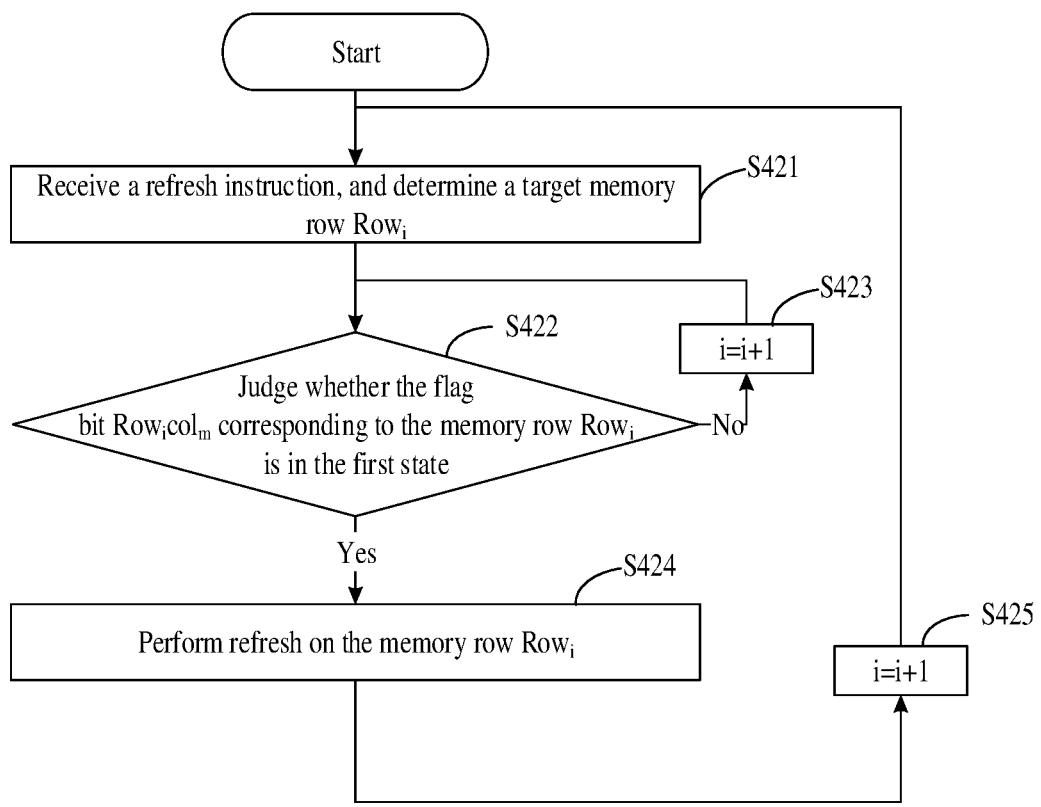
FIG. 6B is a second detailed flow diagram of another method for refreshing provided by some embodiments of the present disclosure.

On the basis of FIG. 2, referring to FIG. 6B, a second detailed flow diagram of another method for refreshing provided by some embodiment of the present disclosure is shown. As shown in FIG. 2 and FIG. 6B, the method may include the following steps.

In step S421, the refresh instruction is received and the target memory row $Row_i$ is determined.

It should be understood that steps S421 and S411 do not have a specific order of execution.

In step S422, whether the flag bit $Row_iCol_m$ corresponding to the $Row_i$ is in the first state is judged.

Here, for the step S422, if the judgment result is NO, step S423 is performed, and if the judgment result is Yes, step S424 is performed.

In step S423, i=i+1, and step S422 is returned to be performed.

In step S424, refresh is performed on the memory row $Row_i$.

In step S425, i=i+1, and step S421 is returned to be performed.

It should be noted that steps S421 to S425 may be understood with reference to steps S321 to S325. It should be noted that in the case where the constructed Allocate instruction is used as the memory allocation instruction, the state of the flag bit of the memory row $Row_i$ is not adjusted after performing refresh on the memory row $Row_i$. That is, step S424 is different from step S324.

In addition, for the step S422, if the judgment result is NO, it may be regarded as ending the refresh instruction, and step S425 may be performed directly.

Figure 6C:
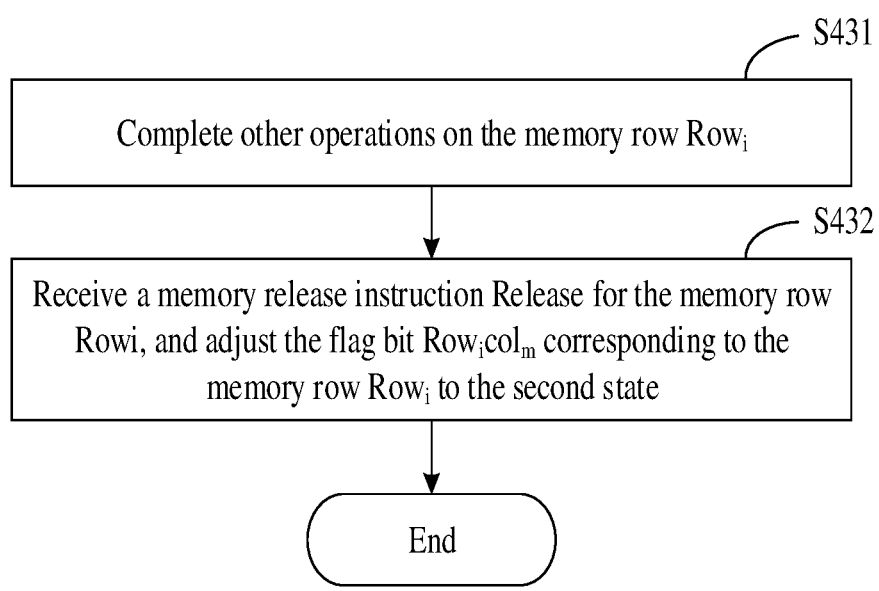
FIG. 6C is a third detailed flow diagram of another method for refreshing provided by some embodiments of the present disclosure.

On the basis of FIG. 2, referring to FIG. 6C, a third detailed flow diagram of another method for refreshing provided by the embodiment of the present disclosure is shown. As shown in FIG. 2 and FIG. 6C, the method may include the following steps.

In step S431, other operations for memory row $Row_i$ are completed.

In step S432, the memory release instruction Release for the memory row $Row_i$ is received, and the flag bit $Row_iCol_m$ corresponding to the memory row $Row_i$ is adjusted to the second state.

That is, after the end of the use of the memory row $Row_i$, a memory release instruction Release is sent to the semiconductor memory. For the semiconductor memory, after receiving the memory release instruction Release, data 0 is written to the flag bit $Row_iCol_m$, and the flag bit $Row_iCol_m$ is adjusted to the second state.

It can be seen from the above that in a case that the word line activation instruction Active is used as the memory allocation instruction, the state of the flag bit is adjusted to the second state after performing refresh on the memory row $Row_i$. In a case that the constructed Allocate instruction is used as the memory allocation instruction, the state of the flag bit is still maintained in the first state after performing refresh on the memory row $Row_i$. The state of the flag bit is adjusted to the second state only after receiving the memory release instruction Release. In this way, the state of the flag bit will not be changed frequently, thus saving power consumption.

To sum up, the embodiment of the present disclosure provides a new working method of memory refresh, in particular to the design of a refresh method in DRAM. Because DRAM is a volatile memory, it needs to perform refresh operation constantly to keep data from being lost. Refresh frequency is a key index of DRAM because refresh frequency is strongly related to the data retention ability and chip power consumption of DRAM. The embodiments of the present disclosure can accurately refresh the memory cell in the interior of the DRAM by utilizing the clarity of the refresh target, thus effectively reducing the refresh power consumption.

Figure 7:
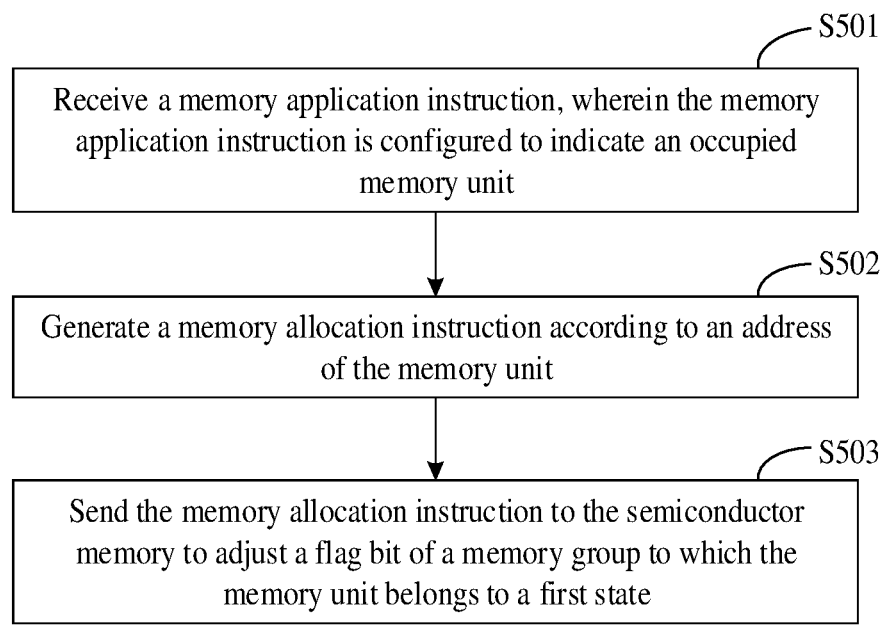
FIG. 7 is a flow diagram of a method for controlling provided by some embodiments of the present disclosure.

In yet another embodiment of the present disclosure, referring to FIG. 7, a flow diagram of a method for controlling provided by some embodiment of the present disclosure is shown. As shown in FIG. 7, the method may include the following steps.

In step S501, a memory application instruction is received, and the memory application instruction is configured to indicate an occupied memory cell.

In step S502, a memory allocation instruction is generated according to the address of the memory cell.

In step S503, the memory allocation instruction is sent to the semiconductor memory to adjust a flag bit of a memory group to which the memory cell belongs to a first state.

It should be noted that the method for controlling provided by the embodiment of the present disclosure is applied to the memory controller. The memory controller is connected to a semiconductor memory and is configured to perform control on the semiconductor memory. A plurality of memory groups and a plurality of flag bits exist in the semiconductor memory. One flag bit has a corresponding relationship with one memory group. The flag bit is at least configured to indicate whether at least one memory cell in one memory group has a specific state. The specific state includes an occupied state. Here, the target memory group includes a memory row, or, the target memory group includes a plurality of memory rows.

Here, the memory allocation instruction may be sent by the user to the memory controller, or it may be automatically generated by the memory controller.

In this way, the flag bit indicates whether an occupied memory cell exists in the memory group, which can provide more information for the control process of the semiconductor memory, improve the control efficiency of the semiconductor memory and reduce the power consumption.

In some embodiments, the method further includes the follow operations.

A memory recovery instruction is received. The memory recovery instruction is configured to indicate at least one memory cell released from occupation.

In response to all memory cells in the memory group being released from occupation, a memory release instruction corresponding to the memory group is generated.

A memory release instruction is sent to the semiconductor memory to adjust the flag bit of the memory group to a second state.

Here, the memory recovery instruction may be sent by the user to the memory controller, or it may be automatically generated by the memory controller.

It should be noted that the first state represents that data 1 is stored in the flag bit, and the second state represents that data 0 is stored in the flag bit. Alternatively, the first state represents that data 0 is stored in the flag bit, and the second state represents that data 1 is stored in the flag bit.

In some embodiments, the plurality of memory groups of the semiconductor memory are divided into a plurality of memory blocks, the method further includes the following operations.

Reading is performed on a flag bit of each of the plurality of memory group in a memory block to determine a target number. The target number is configured to indicate a number of memory groups in which flag bits are in the first state. A refresh period of the memory block is adjusted according to the target number. A refresh instruction is sent to the semiconductor memory based on the refresh period of the memory block.

It should be noted that the scope of memory blocks may be divided according to actual application scenarios. For example, a memory array (Bank) may be regarded as a memory block.

It should be noted that if more memory cells are occupied in the memory block, it is necessary to refresh the memory block at a higher frequency to avoid the data in the occupied memory cells being lost due to volatility and external attacks. If fewer memory cells are occupied in the memory block, the memory block may be refreshed at a lower frequency, and the power consumption can be reduced on the premise of ensuring the refresh effect.

Exemplarily, a mapping relationship between the target number and the refresh period is stored in advance in a semiconductor memory. In the practical working process, the target number may be acquired periodically, a new refresh period is determined according to the mapping relationship, and then a refresh instruction is sent to the semiconductor memory according to the determined refresh period to realize the adjustment of the refresh period. Alternatively, in the practical working process, the target number is acquired when a preset event (for example, the memory application instruction/memory release instruction is received) occurs, a new refresh period is determined according to the mapping relationship, and then a refresh instruction is sent to the semiconductor memory according to the determined refresh period to realize the adjustment of the refresh period. In this way, the refresh period of the memory block may be flexibly adjusted according to the occupied situation of the memory cell, and the power consumption can be reduced on the premise of realizing a better refresh effect.

The embodiment of that present disclosure provides a method for controlling. For the memory where the tag memory area is set, the state of the flag bit in the flag memory area is controlled based on the function of the application memory/release memory to record whether an occupied memory cell exists in the corresponding memory group, which can provide more information for the subsequent control process of the semiconductor memory, thereby improving the control efficiency of the semiconductor memory and reducing the power consumption.

Figure 8:
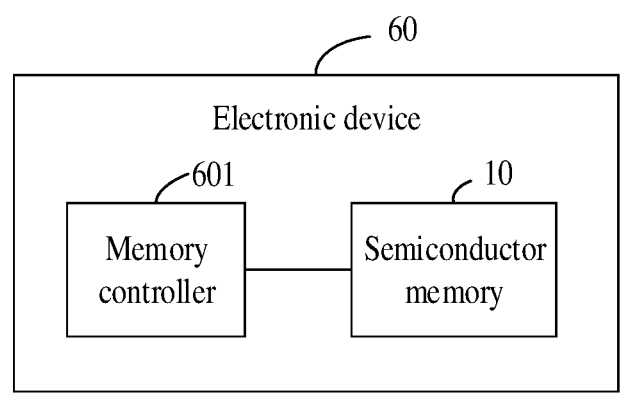
FIG. 8 is a schematic diagram of the composition structure of an electronic device provided by some embodiments of the present disclosure.

In yet another embodiment of the present disclosure, referring to FIG. 8, a schematic structural diagram of an electronic device 60 provided by some embodiment of the present disclosure is shown. As shown in FIG. 8, the electronic device 60 may include a memory controller 601 and a semiconductor memory 10 of any of the above embodiments.

In embodiments of the present disclosure, the semiconductor memory 10 may be a DRAM chip.

Embodiment of the present disclosure provides an electronic device 60. The electronic device 60 includes a memory controller 601 and a semiconductor memory 10. A tag memory area is added to the semiconductor memory 10, and the flag bit indicates whether an occupied memory cell exists in the corresponding memory group, so that more information can be provided for the subsequent control process of the semiconductor memory, the control efficiency of the semiconductor memory is improved, and the power consumption is reduced.

The above is only preferred embodiments of the present disclosure and is not intended to limit the scope of protection of the present disclosure.

It should be noted that, in the present disclosure, the terms "comprising", "including" or any other variation thereof are intended to encompass non-exclusive inclusion, so that a process, method, object or device that includes a set of elements includes not only those elements but also other elements that are not explicitly listed, or also elements inherent to such a process, method, object or device. In the absence of further limitations, an element defined by the phrase "includes a . . . " does not preclude the existence of other identical elements in the process, method, object or device in which it is included.

The above serial numbers of the embodiments of the present disclosure are for description only and do not represent the advantages and disadvantages of the embodiments.

The methods disclosed in several method embodiments provided in the present disclosure can be arbitrarily combined without conflict to obtain new method embodiments.

Features disclosed in several product embodiments provided in the present disclosure can be arbitrarily combined without conflict to obtain new product embodiments.

Features disclosed in several method or device embodiments provided in the present disclosure can be arbitrarily combined without conflict to obtain new method or device embodiments.

The above is only the specific implementation of the present disclosure, but the scope of protection of the present disclosure is not limited thereto. Any skilled person familiar with the technical field can easily think of changes or substitutions within the technical scope disclosed in the present disclosure, and should be covered within the scope of protection of the present disclosure. Therefore, the scope of protection of the present disclosure shall be subject to the scope of protection of the claims.

The embodiments of the present disclosure provide a method for controlling, a semiconductor memory and an electronic device. The semiconductor memory includes a main memory area and a tag memory area. A plurality of memory groups are set in the main memory area, and a plurality of flag bits are set in the tag memory area. Each of the plurality of memory groups has a corresponding relationship with one of the plurality of flag bits, and the flag bit is at least configured to indicate whether at least one memory cell in the memory group has a specific state. The specific state includes an occupied state. In this way, the tag memory area is added in the semiconductor memory, and whether there is an occupied memory cell in the corresponding memory group is indicated by the flag bit, so that more information can be provided for the control process of the semiconductor memory, the control efficiency of the semiconductor memory is improved, and the power consumption is reduced.

What is claimed is:

1. A semiconductor memory comprising a main memory area and a tag memory area, wherein a plurality of memory groups are set in the main memory area and a plurality of flag bits are set in the tag memory area, wherein,
    each of the plurality of memory groups has a corresponding relationship with one of the plurality of flag bits, and the flag bit is at least configured to indicate whether at least one memory cell in the memory group has a specific state, wherein the specific state comprises an occupied state;
    wherein the semiconductor memory is further configured to adjust a flag bit of a memory group to which a memory cell belongs to a first state after receiving a memory allocation instruction for the memory cell;
    wherein the memory allocation instruction is a word line activation instruction or is constructed by utilizing a first reserved code in a memory controller;
    wherein the semiconductor memory is further configured to adjust the flag bit of the memory group to a second state after performing refresh on the memory group; or
    wherein the semiconductor memory is further configured to adjust the flag bit of the memory group to a second state after receiving a memory release instruction for the memory group; wherein the memory release instruction is constructed by utilizing a second reserved code in the memory controller.

2. The semiconductor memory of claim 1, wherein,
    each of the plurality of memory groups comprises a memory row, and a portion, extending to the tag memory area, of the memory row is configured to form a flag bit corresponding to the memory group.

3. The semiconductor memory of claim 1, wherein each of the plurality of memory groups comprises a plurality of memory rows, and a portion, extending to the tag memory area, of one of the plurality of memory rows is configured to form a flag bit corresponding to the memory group.

4. The semiconductor memory of claim 1, wherein, in a case that the specific state comprises at least two states, each of the plurality of flag bits comprises at least two identifiers, and different identifiers are configured to indicate different specific states;
    wherein each of the at least two identifiers occupies a memory cell.

5. A method for refreshing, applied to a semiconductor memory comprising a plurality of memory groups and a plurality of flag bits, wherein each of the plurality of flag bits is configured to indicate at least whether at least one memory cell in one memory group has a specific state, and the specific state comprises an occupied state, wherein the method comprises:
    determining a target memory group according to a preset refresh sequence after receiving a refresh instruction;
    performing reading on a flag bit of the target memory group to obtain a reading result; and
    determining, according to the reading result, whether to perform refresh process on the target memory group.

6. The method for refreshing of claim 5, wherein,
    the target memory group comprises a memory row, or, the target memory group comprises a plurality of memory rows.

7. The method for refreshing of claim 5, wherein determining, according to the reading result, whether to perform refresh process on the target memory group comprises:
    in a case that the flag bit is in a first state, performing refresh process on the target memory group; and
    in a case that the flag bit is in a second state, not performing refresh process on the target memory group, and waiting for a next refresh instruction.

8. The method for refreshing of claim 5, wherein determining, according to the reading result, whether to perform refresh process on the target memory group comprises:
    in a case that the flag bit is in a first state, performing refresh process on the target memory group; and
    in a case that the flag bit is in a second state, not performing refresh process on the target memory group, re-determining a next memory group of the target memory group as the target memory group, and returning to perform the step of performing reading on the flag bit of the target memory group.

9. The method for refreshing of claim 7, further comprising:
    adjusting, after receiving a memory allocation instruction for a memory cell, a flag bit of a memory group to which the memory cell belongs to the first state; and
    adjusting, after performing refresh on the memory group, the flag bit of the memory group to a second state.

10. The method for refreshing of claim 7, wherein,
    adjusting, after receiving a memory allocation instruction for a memory cell, a flag bit of a memory group to which the memory cell belongs to the first state; and
    adjusting, after receiving a memory release instruction for a memory group, a flag bit of the memory group to the second state.

11. The method for refreshing of claim 10, wherein the memory allocation instruction is a word line activation instruction or is constructed by utilizing a first reserved code in a memory controller; and
    the memory release instruction is constructed by utilizing a second reserved code in the memory controller.

12. A method for controlling, applied to a memory controller, wherein the memory controller is connected to a semiconductor memory, the semiconductor memory comprises a plurality of memory groups and a plurality of flag bits, each of the plurality of flag bits is at least configured to indicate whether at least one memory cell in one memory group has a specific state, and the specific state comprises an occupied state, wherein the method comprises:
    receiving a memory application instruction, wherein the memory application instruction is configured to indicate an occupied memory cell;
    generating a memory allocation instruction according to an address of the occupied memory cell; and
    sending the memory allocation instruction to the semiconductor memory to adjust a flag bit of a memory group to which the memory cell belongs to a first state;
    wherein the plurality of memory groups of the semiconductor memory are divided into a plurality of memory blocks, and the method further comprises:
    performing reading on a flag bit of each of the plurality of memory group in a memory block to determine a target number, wherein the target number is configured to indicate a number of memory groups in which flag bits are in the first state;
    adjusting a refresh period of the memory block according to the target number; and sending a refresh instruction to the semiconductor memory based on the refresh period of the memory block.

13. The method for controlling of claim 12, further comprising:
- receiving a memory recovery instruction, wherein the memory recovery instruction is configured to indicate at least one memory cell released from occupation;
- in response to all memory cells in the memory group being released from occupation, generating a memory release instruction corresponding to the memory group; and
- sending the memory release instruction to the semiconductor memory to adjust the flag bit of the memory group to a second state.

* * * * *